(12) United States Patent
Liu

(10) Patent No.: US 12,046,321 B2
(45) Date of Patent: Jul. 23, 2024

(54) COMPILATION METHOD, COMPILATION CIRCUIT, MODE REGISTER AND MEMORY

(71) Applicant: CHANGXIN MEMORY TECHNOLOGIES, INC., Hefei (CN)

(72) Inventor: Geyan Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 387 days.

(21) Appl. No.: 17/651,597

(22) Filed: Feb. 18, 2022

(65) Prior Publication Data
US 2023/0014084 A1    Jan. 19, 2023

Related U.S. Application Data

(63) Continuation of application No. PCT/CN2021/112834, filed on Aug. 16, 2021.

(30) Foreign Application Priority Data

Jul. 9, 2021 (CN) .......................... 202110778319.7

(51) Int. Cl.
G11C 7/10 (2006.01)
G11C 5/06 (2006.01)
G11C 11/4063 (2006.01)
G11C 11/4072 (2006.01)

(52) U.S. Cl.
CPC .............. *G11C 7/1078* (2013.01); *G11C 5/06* (2013.01); *G11C 7/10* (2013.01); *G11C 7/1048* (2013.01); *G11C 7/1051* (2013.01); *G11C 11/4063* (2013.01); *G11C 11/4072* (2013.01)

(58) Field of Classification Search
CPC .......... G11C 5/06; G11C 7/10; G11C 7/1048; G11C 7/1051; G11C 7/1078; G11C 11/4063; G11C 11/4072
See application file for complete search history.

(56) References Cited

U.S. PATENT DOCUMENTS

| | | | |
|---|---|---|---|
| 2006/0002225 A1* | 1/2006 | An | G11C 8/10 365/230.06 |
| 2019/0156872 A1 | 5/2019 | Kim et al. | |
| 2020/0257462 A1* | 8/2020 | Sung | G06F 3/0673 |

FOREIGN PATENT DOCUMENTS

| | | |
|---|---|---|
| CN | 105575419 A | 5/2016 |
| CN | 107393577 A | 11/2017 |
| CN | 113053431 A | 6/2021 |

OTHER PUBLICATIONS

JEDEC Standard—DDR4 Sdram, JESD79-4D, Jul. 2021, Chapter 5 (Year: 2021).*

* cited by examiner

*Primary Examiner* — Tucker J Wright
*Assistant Examiner* — James S Wells
(74) *Attorney, Agent, or Firm* — Syncoda LLC; Feng Ma

(57) ABSTRACT

A compilation method includes the following: receiving a signal to be compiled and a resistance matching signal; performing compilation processing on the signal to be compiled to obtain a compilation result signal; and in the case where the signal to be compiled is a reserved code, performing compatibility selection processing on the compilation result signal according to the resistance matching signal to determine a first compiled value.

20 Claims, 8 Drawing Sheets

COMPILATION METHOD, COMPILATION CIRCUIT, MODE REGISTER AND MEMORY

CROSS-REFERENCE TO RELATED APPLICATIONS

This is a continuation of International Application No. PCT/CN2021/112834 filed on Aug. 16, 2021, which claims priority to Chinese Patent Application No. 202110778319.7 filed on Jul. 9, 2021. The disclosures of these applications are hereby incorporated by reference in their entirety.

BACKGROUND

The mode register is an important component of the Dynamic Random Access Memory (DRAM), which is mainly configured to set the relevant parameters of the dynamic random access memory. Specifically, there are a plurality of code bits in each mode register, and the level states, after being decoded, of different code bits correspond to different parameter values.

SUMMARY

The disclosure relates to, but is not limited to, a compilation method, a compilation circuit, a mode register and a memory.

In a first aspect, the embodiments of the disclosure provide a compilation method, which includes the following operations.

A signal to be compiled and a resistance matching signal are received.

Compilation processing is performed on the signal to be compiled to obtain a compilation result signal.

Compatibility selection processing is performed on the compilation result signal according to the resistance matching signal to determine a first compiled value in the case where the signal to be compiled is a reserved code.

In a second aspect, the embodiments of the disclosure provide a compilation circuit, which includes a signal input end, a compilation unit and a compatibility selection unit.

The signal input end is configured to receive a signal to be compiled and a resistance matching signal.

The compilation unit is configured to perform compilation processing on the signal to be compiled to obtain a compilation result signal.

The compatibility selection unit is configured to, in the case where the signal to be compiled is a reserved code, perform compatibility selection processing on the compilation result signal according to the resistance matching signal and determine a first compiled value.

In a third aspect, the embodiments of the disclosure provide a mode register, which at least includes the compilation circuit as in the second aspect.

In a fourth aspect, the embodiments of the disclosure provide a memory, which includes at least the mode register as in the third aspect.

DETAILED DESCRIPTION

Figure 1:
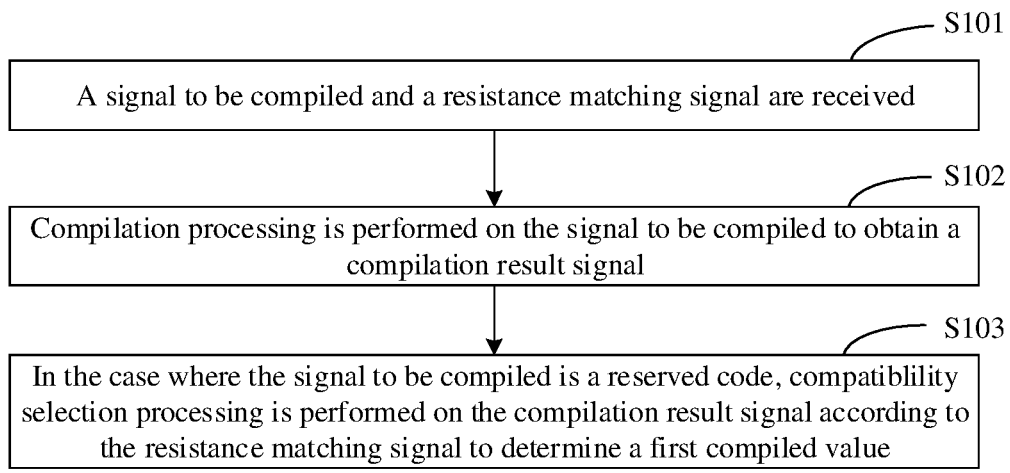
FIG. 1 illustrates a schematic flowchart of a compilation method provided by an embodiment of the disclosure.

The embodiments of the disclosure will be clearly and completely described below in combination with the drawings in the embodiments of the disclosure. It is understandable that the specific embodiments described here are only used to explain the related application, but not to limit the disclosure. In addition, it should be noted that, for ease of description, only the parts related to the relevant application are shown in the drawings.

Unless otherwise defined, all technical and scientific terms used herein have the same meaning as commonly understood by those skilled in the art of the disclosure. The terms used herein are only for the objective of describing the embodiments of the disclosure, and is not intended to limit the disclosure.

In the following description, "some embodiments" are referred to, which describe a subset of all possible embodiments, but it is understood that "some embodiments" may be the same subset or different subsets of all possible embodiments, and can be combined with each other without conflict.

It should be pointed out that the term "first/second/third" involved in the embodiments of the disclosure is only used to distinguish similar objects, and does not represent a specific order of objects. Understandably, the "first/second/third" can be interchanged in specific order or sequence when permitted, so that the embodiments of the disclosure described herein can be implemented in a sequence other than that illustrated or described herein.

Mode registers have poor compatibility with different application environments, resulting in poor performance of DRAM.

There are a plurality of mode registers in DRAM, which are used to set different functions and working modes of DRAM. Specifically, there are a plurality of input bits (or called address codes, address bits, etc.) in each of the mode registers, and the level states of different input bits constitute the signal to be compiled, and the corresponding parameter value is determined after the signal to be compiled is decoded.

In the actual application process, the user sends a Mode Register Set command (MRS Command) to the DRAM by the DRAM controller (or called the DRAM Controller) to set each of the mode registers. In particular, due to the different settings of the Basic Input Output System (BIOS) in different DRAM Controllers, the mode register provides different optional parameters so as to match a plurality of application platforms.

At present, in the technical standard specification (Specification, SPEC) part of Double Data Rate SDRAM (DDR SDRAM, DDR4) of the 4th edition, the compilation rules between the input bit combination and parameter value in the mode register are stipulated. Here, in addition to some clearly defined input bit combinations, there are also some inactivated input bit combinations, namely, reserved codes (Reserved), for designers to use when facing special requirements.

In general, in most cases where there is no special requirement, the reserved code is not activated, and accordingly, there is no compilation circuit in the DRAM for these reserved codes. However, since the DRAM Controller may need to test and control a plurality of different DRAMs and is not designed for a single DRAM, it is possible that the DRAM Controller may issue control commands involving a reserved code. Thus, if there is no circuit for compiling the reserved code in a DRAMs and the DRAM receives the reserved code issued by the DRAM Controller, the mode register in the DRAM is completely inoperative, thereby reducing compatibility of the DRAM with different application platforms.

Specifically, according to DDR4, there are two setting items related to the resistance value in the mode register, which are: (1) output driver resistance (Ron) setting item, also called as Output Driver Impedance Control, see Table 1; (2) end resistance (RTT_WR) setting items, see Table 2.

For example, the DRAM Controller in a certain company test platform tests the DRAMs using the reserved codes in the setting items Ron or RTT_WR, and then the overall test cannot be turned on because there is no compilation circuit for these reserved codes in the mode registers in the DRAMs.

TABLE 1

| A2 | A1 | Output Driver Impedance Control |
|---|---|---|
| 0 | 0 | RZQ/7 |
| 0 | 1 | RZQ/5 |
| 1 | 0 | Reserved |
| 1 | 1 | Reserved |

TABLE 2

| A11 | A10 | A9 | RTT_WR |
|---|---|---|---|
| 0 | 0 | 0 | Dynamic ODT Off |
| 0 | 0 | 1 | RZQ/2 |
| 0 | 1 | 0 | RZQ/1 |
| 0 | 1 | 1 | Hi-Z |
| 1 | 0 | 0 | RZQ/3 |
| 1 | 0 | 1 | Reserved |
| 1 | 1 | 0 | Reserved |
| 1 | 1 | 1 | Reserved |

In particular, both of Tables 1 and 2 come from the SPEC part of DRAM DDR4. A1, A2, A11, A10 and A19 are bits in the corresponding mode registers. The meaning of other related parameters can be seen in the DDR4 file, and the meaning of the related parameters does not affect the understanding of the embodiments of the disclosure, so these parameters will not be described in detail here.

According to this, the embodiments of the disclosure provide a compilation method, the basic idea of which is to receive a signal to be compiled and a resistance matching signal; perform compilation processing on the signal to be compiled to obtain a compilation result signal; and in the case where the signal to be compiled is a reserved code, perform compatibility selection processing on the compilation result signal according to the resistance matching signal to determine a first compiled value. In this way, with the preset compilation rule of the reserved code, the mode register can compile the reserved code sent by the application platform, avoiding the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with different application platforms; besides, since the reserved code provides a resistance matching scheme which is more flexible, the control scheme finally delivered to the user can be adjusted according to the test results, thereby providing better read and write performance.

Hereinafter, the embodiments in the disclosure will be described in detail with reference to the accompanying drawings.

In an embodiment of the disclosure, referring to FIG. 1, a schematic flowchart of a compilation method provided by an embodiment of the disclosure is shown. As shown in FIG. 1, the method may include the following operations.

At S101, a signal to be compiled and a resistance matching signal are revived.

It should be noted that the compilation method provided by the embodiments of the disclosure is applied to the mode register of the DRAM.

In order to match the BIOS settings of the DRAM Controller, the mode register of the DRAM provides some adjustable parameters, so that the DRAM Controller can send an MRS command to the DRAM so as to set the mode register in the DRAM. The compilation method provided in the embodiments of the disclosure is specifically applied to the parameter compilation circuit in the mode register of the DRAM.

In the hardware structure of DRAM, the output driver circuit and the end resistance share a set of pull-up resistances. When data is read out from the DRAM, the pull-up resistance is used as the output resistance Ron and its resistance value must satisfy the range of requirements set by the SPEC for Ron (or referred to as Output Driver Impedance); when data is written into the DRAM, the pull-up resistance is used as the end resistance Rtt_WR and its resistance value must satisfy the requirements set by the SPEC for the Rtt_WR. In addition, the resistance value of each of the output resistance Ron and the end resistance Rtt_WR is not fixed, and a plurality of optional resistance value grades need to be provided to facilitate matching between the DRAM and the different DRAM Controllers.

Therefore, there are some setting items related to the resistance value in the mode register, such as setting items Ron and setting items RTT_WR. For these setting items, there are a plurality of input bits in the mode register, DDR4 SPEC specifies detailed coding rules for these input bits, such as a specific input bit value combinations and compiled values corresponding to the input bit value combinations, which has a specified input bit value combination generally referred to as a control code (or a non-reserved code). An input bit value combination is generally called a control code (or called as a non-reserved code). In addition, DDR4 SPEC also has some inactivated input bit value combinations, that is, DDR4 SPEC does not specify the compiled value corresponding to these input bit value combinations which are generally called as reserved codes.

In some implementations, due to the lack of compilation circuit for the reserved code in the hardware system of the mode register, the mode register may fail to work if the related command involving the reserved code is received. In view of the above, the embodiments of the disclosure provide a compilation method capable of encoding and decoding a reserved code in a setting item related to a resistance value in advance, so as to be better compatible with different DRAM Controllers.

For the compilation method provided in the embodiments of the disclosure, the signal to be compiled and the resistance matching signal need to be received. Here, the signal to be compiled is determined according to the MRS command sent by the DRAM Controller, and the resistance matching signal is used to indicate a resistance mode, such as a high resistance mode or a low resistance mode, in the DRAM.

At S102, the signal to be compiled is performed compilation processing to obtain a compilation result signal.

It should be noted that the signal to be compiled is performed compilation processing to obtain a compilation result signal.

Here, because of the hardware improvement of the compilation circuit, the compilation circuit has designed the compilation part for the reserved code in advance. Therefore, even if the signal to be compiled is the reserved code, the compilation result signal can be obtained without causing direct downtime of the DRAM.

At S103, in the case where the signal to be compiled is a reserved code, compatibility selection processing is performed on the compilation result signal according to the resistance matching signal to determine a first compiled value.

It should be noted that in the mode register, there are a plurality of setting items of different functions, each setting item may have a reserved code, and the reserved code in the embodiments of the disclosure relates in particular to those setting items related to the resistance value of the DRAMs, such as a first reserved code (output resistance reserved code Ron) and a second reserved code (end resistance reserved code Rtt_WR).

Since the parameter values of these setting items are used to adjust the resistance value of the resistance so as to be compatible with the application platform, in the case where the signal to be compiled is the reserved code, it is also necessary to determine the first compiled value according to the resistance matching signal so that the DRAMs and the DRAM Controller are matched. In other words, in the case where the signal to be compiled is the reserved code, it is also necessary to consider the resistance matching signal to determine the final compiled value.

Specifically, a same reserved code may correspond to different compiled values depending on different resistance matching signals. Therefore, in some embodiments, the operation of performing compatibility selection processing on the compilation result signal according to the resistance matching signal to determine the first compiled value may include the following operations.

If the resistance matching signal is a first level signal, a first compiled value is determined as a first preset value corresponding to the reserved code.

If the resistance matching signal is a second level signal, the first compiled value is determined as a second preset value corresponding to the reserved code.

It should be noted that in the embodiment of the disclosure, each reserved code corresponds to two compiled values, so as to be better compatible with different control platforms.

If the resistance matching signal is a first level signal, a first compiled value is determined as a first preset value corresponding to the reserved code; if the resistance matching signal is a second level signal, the first compiled value is determined as a second preset value corresponding to the reserved code. Here, the first preset value and the second preset value are different.

Here, the level states of the first level signal and the second level signal are different. For example, the first level signal may be a high level signal, also denoted by "1"; the second level signal may be a low level signal, also denoted "0". Specifically, the level state of the resistance matching signal is used to indicate the resistance value state of the desired pull-up resistance, for example, a high resistance state may be indicated with a low level signal, and a low resistance state may be indicated with a high level signal.

Thus, in the case where the signal to be compiled is a reserved code, the first compiled value can be determined to be a first preset value or a second preset value according to the reserved code itself and the resistance matching signal, thereby providing different output resistance values/end resistance values to enable matching of the DRAMs with different DRAM Controllers.

Further, in some embodiments, in the case where the signal to be compiled is a non-reserved code, the method may further include the following operation.

A second compiled value is determined according to the compilation result signal.

It should be noted that for those non-reserved codes specified by the JEDEC DDR4 SPEC, the second compiled value may be directly determined according to the compilation result signal.

It should be understood that for the non-reserved code, only the compiled value needs to be determined according to the contents of the non-reserved code itself; for the reserved code, the compiled value needs to be determined according to the resistance matching signal and the reserved code itself.

Furthermore, the compiled value of the reserved code is not clearly specified in the JEDEC DDR4 SPEC, so the compiled value of the reserved code can be selected and determined according to an actual application scenario. Only exemplary designs are given below.

In some embodiments, before the signal to be compiled and the resistance matching signal are received, the method further includes the following operation.

The value of the first compiled value is determined according to the value of the second compiled value.

It should be noted that for a specific setting item, the value of the first compiled value may be designed accordingly according to the compiled value specified in the JEDEC DDR4 SPEC (that is, the value of the second compiled value).

In one specific embodiment, the operation of determining the value of the first compiled value according to the value of the second compiled value includes the following operations.

Selection is performed from the value of the second compiled value to obtain at least one candidate value.

The at least one candidate value is determined as the value of the first compiled value.

It should be noted that, in some embodiments, the candidate values may be selected from values of the second compiled values and are used as the values of the first compiled values. Thus, by taking part of the value of the second compiled value as the value of the first compiled value, the output end of the non-reserved code and the partial circuit can be reused during hardware circuit design, thereby saving the circuit layout area.

Here, the specific selection rule may be determined according to an actual application scenario, which is not limited in the embodiments of the disclosure. For example, the value of the second compiled value adapted to extreme conditions may be used as a candidate value to maximize the compatibility range of the DRAM. For another example, in some embodiments, in the case where the number of reserved codes is a, the method may further include the following operations.

A number a of first candidate values and one second candidate value are determined according to the at least one candidate value.

The i-th first candidate value is determined as the first preset value corresponding to the i-th reserved code, and the second candidate value is determined as the second preset value corresponding to the i-th reserved code value.

Here, i and a are positive integers, and i is less than or equal to a.

It should be noted that, if there are a reserved codes, (a+1) candidate values may be selected from the second compiled value, which are specifically a first candidate values and one second candidate value. Then, the i-th first candidate value is determined as the first preset value corresponding to the i-th reserved code, and the second candidate value is determined as the second preset value corresponding to the i-th reserved code.

For example, for the setting item RTT_WR, as shown in the above Table 2, the values of the second compiled value are Dynamic ODT Off, RZQ/2, RZQ/1, Hi-Z, and RZQ/3. The meanings of the above parameters can be found in the JEDEC DDR4 standard document, which is not described in detail herein. At this time, the following candidate values are selected from the second compiled values: Dynamic ODT Off, RZQ/2, RZQ/1, and RZQ/3; then, the first preset values corresponding to the three different reserved codes in the setting item RTT_WR are respectively determined as RZQ/2, RZQ/1 and RZQ/3 (the specific correspondence relationship can be flexibly determined), and the second preset values corresponding to the three different reserved codes are respectively determined as Dynamic ODT Off. The details are shown in Table 3 below.

TABLE 3

| A11 | A10 | A9 | RTT_WR |
|---|---|---|---|
| 0 | 0 | 0 | Dynamic ODT Off |
| 0 | 0 | 1 | RZQ/2 |
| 0 | 1 | 0 | RZQ/1 |
| 0 | 1 | 1 | Hi-Z |
| 1 | 0 | 0 | RZQ/3 |
| 1 | 0 | 1 | RZQ/2 or Dynamic ODT Off |
| 1 | 1 | 0 | RZQ/1 or Dynamic ODT Off |
| 1 | 1 | 1 | RZQ/3 or Dynamic ODT Off |

In another specific embodiment, the operation of determining the value of the first compiled value according to the value of the second compiled value may includes the following operations.

Selection is performed from the value of the second compiled value to obtain at least one candidate value.

The at least one candidate value is adjusted to obtain at least one adjusted value.

The at least one candidate value and the at least one adjusted value are determined as the values of the first compiled value.

It should be noted that, after the candidate value is determined from the second compiled value, the candidate value may be adjusted to obtain the adjusted value, and the candidate value and the adjusted value are determined as the first compiled value. In this way, the compiled values of the setting items are actually slightly more than those specified by JEDEC DDR4 SPEC, thus providing more resistance matching schemes.

Here, the specific adjustment method may be determined according to an actual application scenario, which is not specifically limited in the embodiments of the disclosure. Illustratively, in some embodiments, in the case where the number of reserved codes is a, the number of the at least one candidate value is a, and the number of the at least one adjusted value is a.

Correspondingly, the method may further include the following operation.

The i-th candidate value is determined as the first preset value corresponding to the i-th reserved code, and the i-th adjusted value is determined as the second preset value corresponding to the i-th reserved code.

Here, i and a are positive integers, and i is less than or equal to a.

It should be noted that if there are a reserved codes, a candidate values may be selected from the second compiled value, and after the a candidate values are adjusted, a adjusted values may be obtained, and at this time, the a candidate values are respectively determined as the respective first preset values of the a reserved codes, and the a adjusted values are respectively determined as the second preset values of the a reserved codes.

In particular, for the setting item Ron, as in the above Table 1, the values of the second compiled values are RZQ/5 and RZQ/7. RZQ represents the calibrated standard resistance value, which is 240 ohms in DDR4 JEDEC SPEC. RZQ/5 represents the standard resistance value divided by five, and RZQ/7 represents the standard resistance value divided by seven. Base on the above, in some embodiments, in the case where the reserved code is the first reserved code (reserved code Ron), the operation of adjusting the at least one candidate value to obtain at least one adjusted value may include the following operation.

If the i-th candidate value is the ratio of the preset resistance value to n, the i-th adjusted value is determined as the ratio of the preset resistance value to (n+1); where i and n are positive integers.

It should be noted that a specific adjustment method is as follows. If the candidate value is the ratio of the preset resistance value to n, the corresponding adjusted value of the candidate value is the ratio of the preset resistance value to (n+1).

That is to say, for the setting item Ron, as shown in the above Table 1, the values of the second compiled value are RZQ/5 and RZQ/7, and the setting item Ron includes two reserved codes. In this case, all values of the second compiled value are candidate values; after that, the adjusted value corresponding to RZQ/5 is determined as RZQ/6, and the adjusted value corresponding to RZQ/7 is determined as RZQ/8; finally, a first preset value and a second preset value of one reserved code are determined as RZQ/5 and RZQ/6, respectively; the first preset value and the second preset value of the other reserved code are determined as RZQ/7 and RZQ/8, respectively. The details are shown in Table 4 below.

TABLE 4

| A2 | A1 | Output Driver Impedance Control |
|---|---|---|
| 0 | 0 | RZQ/7 |
| 0 | 1 | RZQ/5 |
| 1 | 0 | RZQ/7 or RZQ/8 |
| 1 | 1 | RZQ/5 or RZQ/6 |

Here, the feasibility analysis on the adjustment of RZQ/n to RZQ/(n+1) is as follows.

When data is read out from the DRAM, the output driver resistance Ron is reduced within the allowable range specified by the SPEC, thereby enhancing the drive capability and improving the integrity of the output signal. DDR4 JEDEC SPEC specifies that the output resistance Ron has two resistance grades, one 34 ohms ($\Omega$) and one is 48$\Omega$. In addition, in the DRAM, the calibrated standard resistance value RZQ is 240$\Omega$.

For the grade where the output resistance Ron is 34 ohms, the minimum Ron resistance value $\geq 34 \times 0.83 = 28.22\Omega$ within the allowable range of deviation; although SPEC recommends a parameter of RZQ/7=240/7=34.29$\Omega$, RZQ/8=240/8=30$\Omega$ also complies with the allowable deviation of SPEC.

For the grade where the output resistance Ron is 48 ohms, the minimum Ron resistance value $\geq 48 \times 0.83 = 39.84\Omega$ within the allowable range of deviation; although the recommended parameter for SPEC is RZQ/5=240/5=48$\Omega$, RZQ/6=240/6=40$\Omega$ also complies with the allowable deviation of SPEC.

0.83 is the coefficient of the minimum Ron resistance value within the allowable deviation range specified in DDR4 JEDEC SPEC compared to the recommended resistance value.

As can be seen from the above, the Ron resistance value obtained by RZQ/(N+1) complies with the SPEC.

In particular, in the DRAM process, the calibrated standard resistance value RZQ may not accurately achieve 240$\Omega$, so it is possible that RZQ/(N+1) is closer to the SREC standard than RZQ/N during the test. In this case, a reserved code may be enabled, such as modifying a preset control program or modifying hardware circuitry, so as to provide a better resistance matching scheme.

In this way, with the preset compilation rule of the reserved code, the mode register can compile the reserved code issued by the application platform, avoiding the case that the mode register cannot work after receiving the reserved code; in addition, the compilation result of the reserved code is different according to the difference of the resistance matching signal, so that the mode register can adjust the resistance value in the DRAM, so as to match the different application platforms, which improves the compatibility of the mode register with the different application platforms; furthermore, since the reserved code provides a resistance matching scheme which is more flexible, the control scheme finally delivered to the user can be adjusted according to the test results, thereby providing better read and write performance.

The compilation method will be further explained below in combination with the specific compilation circuit structure.

In some embodiments, the compilation circuit may include a first compilation unit, a second compilation unit, and a compatibility selection unit, and the method may further include the following operations.

In the case where the signal to be compiled is a reserved code, the first compiled value is determined by the first compilation unit and the compatibility selection unit.

In the case where the signal to be compiled is a non-reserved code, the second compiled value is determined by the second compilation unit.

It should be noted that the compilation circuit may be divided into a first compilation unit, a second compilation unit, and a compatibility selection unit. The first compilation unit is a unit that compiles the reserved code, and since the compiled value of the reserved code needs to be determined jointly depending on the compilation result signal and the resistance matching signal, the first compiled value is determined by the first compilation unit and the compatibility selection unit in the case where the signal to be compiled is the reserved code; the second compilation unit is a unit that compiles the non-reserved code, and in the case where the signal to be compiled is the non-reserved code, the second compiled value is directly determined by the second compilation unit.

Furthermore, in some embodiments, the method may further include the following operation.

A first-class non-reserved code and a second-class non-reserved code are determined. The first-class non-reserved code includes a non-reserved code having the same compiled value as the reserved code, and the second-class non-reserved code includes the remaining non-reserved code in the non-reserved code except for the first-class non-reserved code.

Correspondingly, the second compilation unit includes a second alpha compilation unit and a second beta compilation unit, and the method further includes the following operations.

In the case where the signal to be compiled is a reserved code or a first-type of non-reserved code, the first compiled value is determined by the first compilation unit, the second alpha compilation unit, and the compatibility selection unit.

In the case where the signal to be compiled is the second-class non-reserved code, the third compiled value is determined by the second beta compilation unit. The third compiled value is the remaining compiled value in the second compiled value except for the first compiled value.

It should be noted that, in order to realize circuit reuse, the non-reserved code is classified into a first-class non-reserved code and a second-class non-reserved code. The first-class non-reserved code includes a non-reserved code having the same compiled value as the reserved code, and the second-class non-reserved code includes a non-reserved code other than the first-class non-reserved code. In other words, the compiled value of the first-class non-reserved code is also the compiled value of the reserved code, whereas the compiled value of the second-class non-reserved code is only the compiled value of the non-reserved code.

Accordingly, the second compiled value may also be classified into a first compiled value and a third compiled value, the third compiled value refers to the part of the second compiled value except for the first compiled value. In other words, the first compiled value is also the compiled value of the first-class non-reserved code or the reserved code, whereas the third compiled value is only the compiled value of the non-reserved code.

Base on this, the second compilation unit is divided into a second alpha compilation unit and a second beta compilation unit. The second alpha compilation unit is configured to compile the first-class non-reserved code, and the second beta compilation unit is configured to compile the second-class non-reserved code. In this case, the compilation process may specifically include the following operations.

For a reserved code or a first-class non-reserved code, a first compiled value is determined by a first compilation unit, a second compilation unit, and a compatibility selection unit; for the second-class non-reserved code, the third compiled value is directly determined by the second beta compilation unit.

In this way, the compilation circuit of the reserved code reuses the part of the compilation circuit and the output end of the first-class non-reserved code, thereby saving the circuit area.

Furthermore, in some embodiments, the operation of determining the first compiled value by the first compilation unit, the second alpha compilation unit, and the compatibility selection unit may include the following operations.

Compilation processing is performed on the signal to be compiled by the first compilation unit to obtain a first compilation processing signal.

Compilation processing is performed on the signal to be compiled by the second alpha compilation unit to obtain a second alpha compilation processing signal.

A logical operation is performed on the first compilation processing signal, the second alpha compilation processing signal, and the resistance matching signal by the compatibility selection unit, and the first compiled value is determined according to a logical operation result.

It should be noted that an example of a circuit processing procedure for determining the first compiled value is as follows:

(1) The first compilation signal may be obtained by performing compilation processing on the signal to be compiled by the first compilation unit. Here, the first compilation signal may indicate which reserved code the signal to be compiled is (because the compiled value of the reserved code needs to be determined according to the reserved code itself and the resistance matching signal).

(2) The second alpha compilation signal may be obtained by performing compilation processing on the signal to be compiled by the second compilation unit. Here, the second alpha compilation signal may indicate not only whether the signal to be compiled is a first-class non-reserved code, but also which of the first-class non-reserved code (because the compiled value of the non-reserved code needs to be determined according to the non-reserved code itself).

(3) The first compilation signal, the second alpha compilation signal and the resistance matching signal are logically calculated, and a specific value is determined according to the logically calculated result. Here, the algorithm of the logical operation needs to be designed according to different application scenarios.

In this way, by the compilation method provided in the embodiments of the disclosure, both the reserved code and the non-reserved code may be decoded, and even if a command about the reserved code is received, the DRAM can still work normally without downtime; in addition, for the reserved code, the final compiled value needs to be determined according to the resistance matching signal so that the DRAM can match different DRAM Controllers, finally improve compatibility of the DRAM, and provide optimum read and write performance.

In conclusion, the embodiments of the disclosure belong to the design field of Synchronous Dynamic Random Access Memory (SDRAM) DDR4, and are specifically applied to the mode registers in the DRAMs. In the latest version of JEDEC DDR4 SPEC, there is still a definition of reserved codes for partial mode registers, which are also available for different DRAM Controller designers. Therefore, different DRAM Controller designs may apply reserved codes to different coding environments, resulting in that part of DRAMs are not compatible with DRAM Controller. In order to improve the compatibility of DDR4 circuit so as to adapt to more DRAM Controller design schemes, these reserved codes can be coded and decoded in advance in the design of DRAMs.

Specifically, in DDR4, the output driver circuit and the end resistance share a set of pull-up resistances. When data is read out from the DRAM, the pull-up resistance is used as the output driver circuit whose output resistance Ron must satisfy the range of requirements set by the SPEC. When data is written to the DRAM, as the end resistance Rtt_WR, the pull-up resistance must satisfy the requirements set by the SPEC for the Rtt_WR.

That is to say, the objective of the embodiments of the disclosure is to preset the resistance-related reserved codes defined in the different mode registers in the DDR4 JEDEC SPEC, so that better compatibility with the BIOS settings of different DRAM Controllers can be achieved; at the same time, each reserved code will have two compiled values, which are selected and compiled by compatibility selection circuit to match different DRAM Controller platforms; in addition, since there may be some errors in the DRAM process, according to different chip test results, if the compiled value of the reserved code is closer to the standard value of the DDR4, the reserved code may be enabled, and the specified compiled value may be selected by the compatibility selection circuit to provide the optimal end matching resistance, thereby obtaining better read and write signal integrity.

In addition, the embodiments of the disclosure further provide a specific compilation rule that each reserved code may correspond to a RZQ/N or RZQ/N+1 for a first reserved code (reserved code Ron) at the same time. How to decide whether the corresponding RZQ/N or RZQ/N+1 may be selected by the compatibility selection circuit according to the final chip test result, and the best data output signal performance may be selected as the judgment standard; for the second reserved code (Rtt_WR reserved code), each of the reserved codes may correspond to RZQ/N or Dynamic ODT Off at the same time, as described above.

In this way, with the preset reserved codes related to the resistance values defined in the different mode registers in the DDR4 JEDEC SPEC, better compatibility with the BIOS settings of different DRAM Controllers can be achieved.

In the compilation method provided by the embodiments of the disclosure, a signal to be compiled and a resistance matching signal are received; compilation processing is performed on the signal to be compiled to obtain a compilation result signal; and in the case where the signal to be compiled is a reserved code, compatibility selection processing is performed on the compilation result signal according to the resistance matching signal to determine a first compiled value. In this way, with the preset compilation rule of the reserved code, the mode register can compile the reserved code sent by the application platform, avoiding the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with different application platforms; furthermore, since the reserved code provides a resistance matching scheme which is more flexible, the control scheme finally delivered to the user can be adjusted according to the test result, thereby providing better read and write performance.

Figure 2:
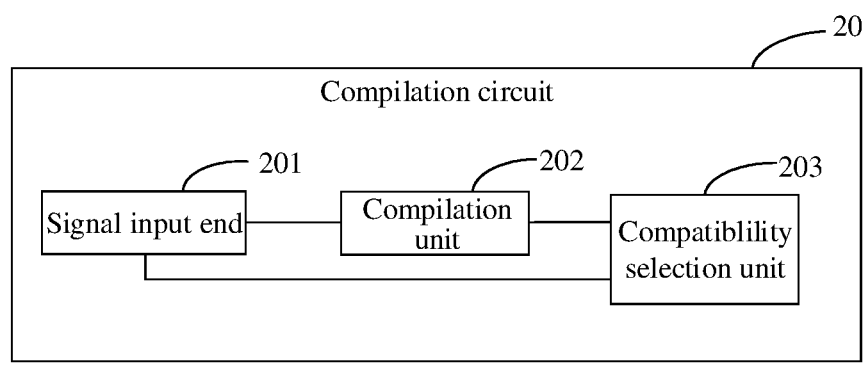
FIG. 2 illustrates a schematic structural diagram of a compilation circuit provided by an embodiment of the disclosure.

In another embodiment of the disclosure, referring to FIG. 2, a schematic structural diagram of a compilation circuit 20 provided by an embodiment of the disclosure is shown. As shown in FIG. 2, the compilation circuit 20 includes a signal input end 201, a compilation unit 202 and a compatibility selection unit 203.

The signal input end 201 is configured to receive a signal to be compiled and a resistance matching signal.

The compilation unit 202 is configured to perform compilation processing on the signal to be compiled to obtain a compilation result signal.

The compatibility selection unit 203 is configured to, in the case where the signal to be compiled is a reserved code, perform compatibility selection processing on the compilation result signal according to the resistance matching signal and determine a first compiled value.

It should be noted that, as shown in FIG. 2, the compilation circuit includes a signal input end 201, a compilation unit, and a compatibility selection unit 203. The signal input end 201 is configured to receive a signal to be compiled and a resistance matching signal; the compilation unit 202 is configured to perform compilation processing on a signal to be compiled, and output a compilation result signal; the compatibility selection unit 203 is connected to both the compilation unit 202 and the signal input end 201, and is configured to perform compatibility selection processing on the compilation result signal according to the resistance matching signal in the case where the signal to be compiled is the reserved code, so as to obtain the first compiled value.

Here, the reserved code includes at least a first reserved code and a second reserved code. The first reserved code is an output driver resistance (Ron) reserved code and the second reserved code is an end resistance (RTT_WR) reserved code.

Furthermore, in some embodiments, the compatibility selection unit 203 is specifically configured to: determine the first compiled value as a first preset value corresponding to the reserved code in the case where the signal to be compiled is a reserved code and the resistance matching signal is a first level signal, and determine the first compiled value as a second preset value corresponding to the reserved code in the case where the signal to be compiled is a reserved code and the resistance matching signal is a second level signal.

It should be noted that each reserved code corresponds to two preset values, and if the resistance matching signal is a first level signal, the compatibility selection unit 203 determines the first compiled value as the first preset value corresponding to the reserved code; if the resistance matching signal is a second level signal, the compatibility selection unit 203 determines the first compiled value as the second preset value corresponding to the reserved code. The first level signal may be designed as a low level signal, and the second level signal may be designed as a high level signal.

Furthermore, in some embodiments, the compilation circuit 20 is further configured to determine a second compiled value according to the compilation result signal in the case where the signal to be compiled is a non-reserved code.

It should be noted that for the non-reserved code, the compilation circuit 20 determines the second compiled value directly from the compilation result signal.

Furthermore, in some embodiments, the compilation unit 202 includes a first compilation unit and a second compilation unit.

The first compilation unit is configured to compile the signal to be compiled to obtain a first compilation result signal.

The second compilation unit is configured to compile the signal to be compiled to obtain a second compilation result signal.

It should be noted that the compilation unit 202 may be divided into a first compilation unit and a second compilation unit. The first compilation unit is configured to compile the reserved code to obtain a first compilation result signal; the second compilation unit is configured to compile the non-reserved code to obtain a second compilation result signal.

Furthermore, in some embodiments, the non-reserved code includes a first-class non-reserved code, and the second compilation unit includes a second alpha compilation unit.

The second alpha compilation unit is configured to perform compilation processing on the signal to be compiled to obtain a second alpha compilation result signal.

The compatibility selection unit 203 is specifically configured to, in the case where the signal to be compiled is a first-class non-reserved code or where the signal to be compiled is a reserved code, perform a logical operation on the first compilation result signal, the second alpha compilation result signal and the resistance matching signal, and determine the first compiled value according to a logical operation result.

In some embodiments, the non-reserved code further includes a second-class non-reserved code, and the second compilation unit further includes a second beta compilation unit.

The second beta compilation unit is configured to perform compilation processing on the signal to be compiled to obtain a second beta compilation result signal; and directly determine a third compiled value according to the second beta compilation result signal in the case where the signal to be compiled is a second-class non-reserved code.

It should be noted that, in order to save the circuit area, the non-reserved code may be classified into two types: the first-class non-reserved code and the second-class non-reserved code. The first-class non-reserved code includes a non-reserved code having the same compiled value as the reserved code; the second-class non-reserved code corresponds to other non-reserved codes except for the first-class non-reserved code.

Accordingly, the second compiled value may be classified into a first compiled value and a third compiled value. The third compiled value includes the part of the second compiled value except for the first compiled value.

In this case, the compilation processing of the reserved code may be combined with part of the first type of reserved code, thereby saving the circuit area. Therefore, the second compilation unit may be divided into a second alpha compilation unit and a second beta compilation unit.

For the first-class non-reserved code or the reserved code, the first compilation unit 201 and the second alpha compilation unit perform compilation processing to obtain the first compilation result signal and the second alpha compilation result signal, and then the compatibility selection unit 203 performs a logical operation on the first compilation result signal and the second alpha compilation result signal to determine the first compiled value.

For the second-class non-reserved code, the second compilation unit performs compilation processing to obtain the second beta compilation result signal, and directly determines the third compiled value according to the second beta compilation result signal.

In conclusion, in order to better adapt to the use of reserved codes in DRAMs in different DRAM Controller design schemes, the two mode setting reserved codes related to resistance are compiled in advance in DDR4 design, so as to further improve compatibility of DRAMs with different system platforms; at the same time, the compatibility selection circuit is used to multi-select the circuit, so that in the final chip test, the DRAM system can have better signal read and write performance.

The embodiments of the disclosure include, in an aspect, precoding the two mode-setting reserved codes defined in the DDR4 SPEC at the time of design; in another aspect, the compilation circuit includes three parts: (1) a SPEC Defined Decode Block (corresponding to the above second encoding unit); (2) a SPEC Reserved Decode Block (corresponding to the above first encoding unit); (3) a DFT Block For Better Compatibility (corresponding to the above compatibility selection unit); in yet another aspect, the above three parts of circuits are all used to implement the improved SPEC compilation truth table (for example, Table 3 and Table 4) as the object, including various specific circuit structures and circuit logic; in still another aspect, by means of the compatibility selection circuit, more end resistance matching schemes can be provided when the final chip is tested after chip forming, so as to obtain better signal read and write performance.

The embodiments of the disclosure provide a compilation circuit, which includes: a signal input end, configured to receive a signal to be compiled and a resistance matching signal; a compilation unit, configured to perform compilation processing on the signal to be compiled to obtain a compilation result signal; and a compatibility selection unit, configured to, in the case where the signal to be compiled is a reserved code, perform compatibility selection processing on the compilation result signal according to the resistance matching signal and determine a first compiled value. In this way, with the preset compilation rule of the reserved code, the mode register can compile the reserved code sent by the application platform, avoiding the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with different application platforms; furthermore, since the reserved code provides a resistance matching scheme which is more flexible, the control scheme finally delivered to the user can be adjusted according to the test result, thereby providing better read and write performance.

In another embodiment of the disclosure, the setting item Ron is used as an example to provide a specific example of the compilation circuit.

Figure 3:
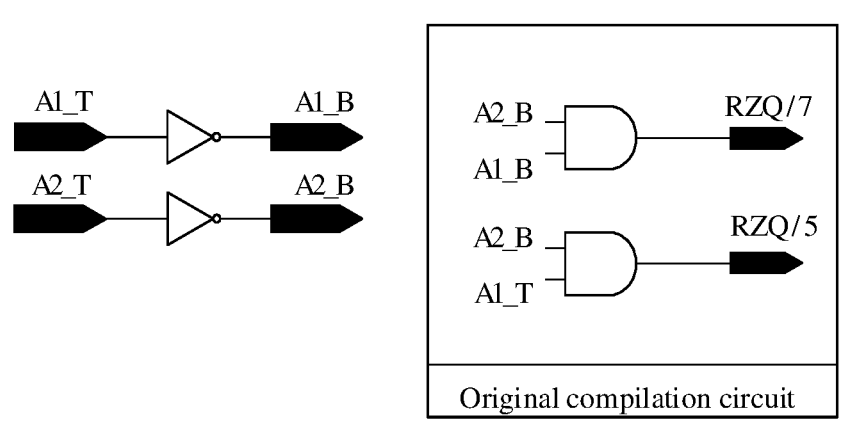
FIG. 3 illustrates a detailed schematic structural diagram of a compilation circuit provided by some implementations.

The above Table 1 shows the SPEC original definition table of the setting item Ron in some implementations, and the specific compilation circuit is shown in FIG. 3. The above Table 4 shows the SPEC improvement definition table of the setting item Ron in the embodiments of the disclosure, and the specific compilation circuit is shown in FIG. 4.

As can be seen from Table 4, when the signal to be compiled is a reserved code, the compiled value needs to be determined according to the reserved code itself and the resistance matching signal. Specifically, if the resistance matching signal is 1, the compiled value of the reserved code is RZQ/N; on the contrary, if the resistance matching signal is 0, the compiled value of the reserved code is RZQ/(N+1). Here, the mapping relationship between the resistance matching signal and the specific compiled value may be determined according to an actual application scenario, which is not limited in the embodiments of the disclosure.

Figure 4:
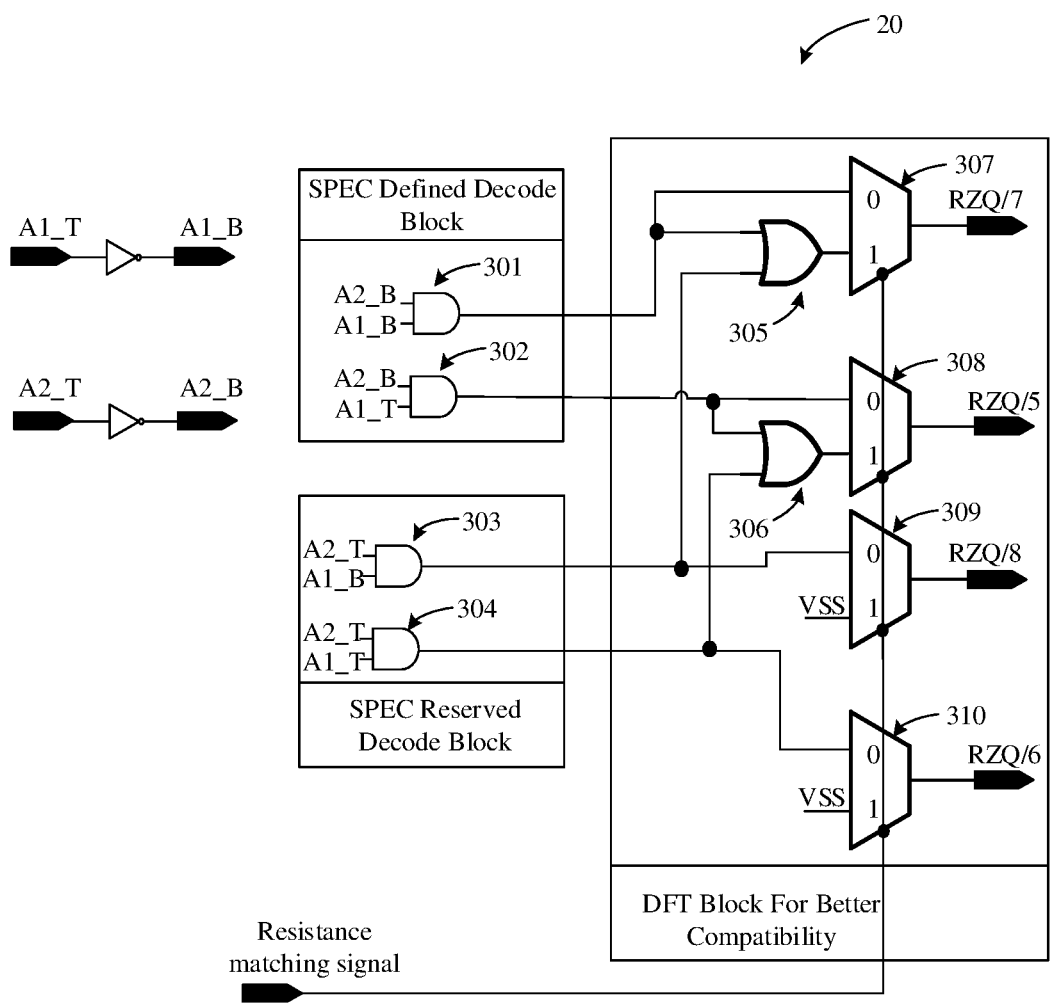
FIG. 4 illustrates a detailed schematic structural diagram of a compilation circuit provided by an embodiment of the disclosure.

As shown in FIG. 4, the compilation circuit 20 includes an operator 301, an operator 302, an operator 303, an operator 304, an operator 305, an operator 306, a data selector 307, a data selector 308, a data selector 309, and a data selector 310. The operators 301 to 304 are dual-input AND gates, and the operators 305 to 306 are dual-input OR gates, please refer to FIG. 4 for the specific connection of the above devices, and details are not described herein.

As shown in FIG. 4, from the view of functions, the compilation circuit 20 can be divided into three parts: (1) a SPEC Defined Decode Block; (2) a SPEC Reserved Decode Block; and (3) a DFT Block For Better Compatibility.

(1) The SPEC Defined Decode Block includes the operator 301 and the operator 302. In particular, all the non-reserved codes are the first-class non-reserved codes in essence for the setting item Ron, and therefore, there is no further division for the SPEC Defined Decode Block.

(2) The SPEC Reserved Decode Block includes the operator 303 and the operator 304.

(3) The DFT Block For Better Compatibility includes the operator 305, the operator 306, the data selector 307, the data selector 308, the data selector 309, and the data selector 310.

According to the compilation circuit in FIG. 4, the specific compilation principle is as follows. In particular, according to the definition of DDR4, the setting item Ron is encoded by the three input bits A2 and A1 of the mode register MR1. A1_T represents the signal value of A1, and A1_B represents the signal value of A1 after non-operation. The input bit combination of Ron is described below by two bit values, for example, 10, which in turn represents the signal of A2 as logic 1 and the signal of A1 as logic 0.

If the signal to be compiled is a non-reserved code, for example, 00, at this time, the operator 301 outputs logic 1, the operator 302 outputs logic 0, the operator 303 outputs logic 0, the operator 304 outputs logic 0, the operator 305 outputs logic 1, the operator 306 outputs logic 0, both of the input ends of the data selector 307 are logic 1, then the output end RZQ/7 is high level, the other output ends are low level, and the final compiled value is RZQ/7.

If the signal to be compiled is a reserved code, for example, 10, the operator 301 outputs logic 0, the operator 302 outputs logic 0, the operator 303 outputs logic 1, the operator 304 outputs logic 0, and the operator 305 outputs logic 1, at this time, the two input ports of the data selector 307 are logic 0 and logic 1 respectively. Since one of the input ports of the data selector 309 is the ground signal VSS, which is constant logic 0, the two input ports of the data selector 309 are also logic 0 and logic 1, respectively. At this time, if the resistance matching signal is logic 0, data selector 307 selects output logic 0, the data selector 309 selects output logic 1, output end RZQ/8 is high level, other output ends are low level, and the final compiled value is RZQ/8; conversely, if the resistance matching signal is logic 1, the data selector 307 outputs logic 1, the data selector 309 outputs logic 0, the output end RZQ/7 is high level, the other output ends are low level, and the final compiled value is RZQ/7.

Figure 5:
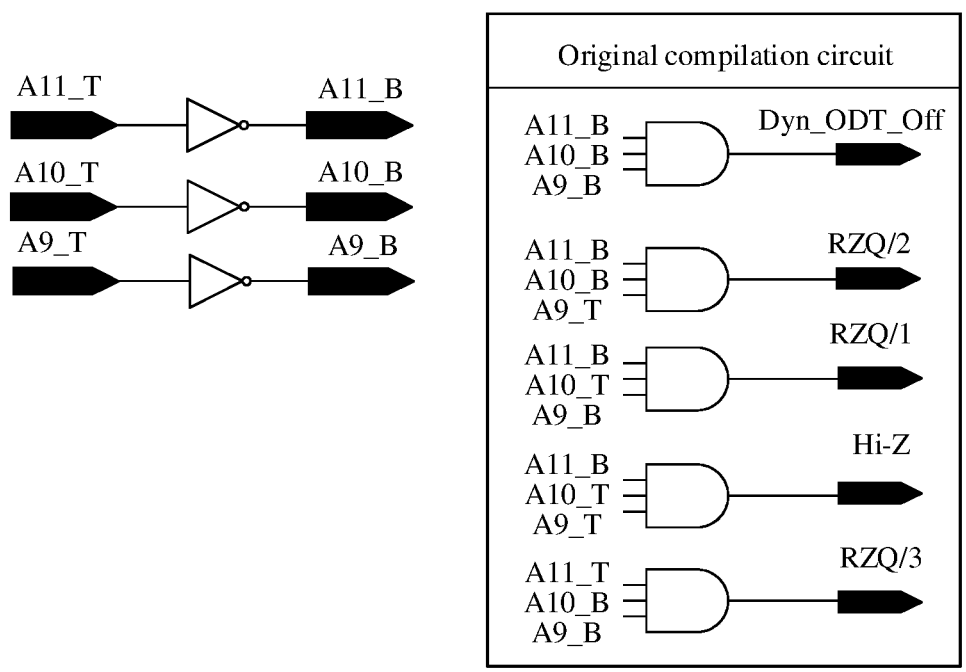
FIG. 5 illustrates a detailed schematic structural diagram of another compilation circuit provided by some implementations.

It should be understood that FIG. 5 is only one circuit implementation method of Table 4 for a compilation circuit. Due to the diversity of logic devices, even for the same compilation truth table, it can be realized by a plurality of circuit structures, which is not exhaustive in the embodiments of the disclosure. Therefore, the corresponding circuit structure is within the protection scope of the embodiments of the disclosure as long as it conforms to the idea in the embodiments of the disclosure that the reserved code is coded and decoded in advance according to the resistance matching signal.

In addition, the application scenario of the embodiments of the disclosure generally appears in the test before the delivery to the user. In the usage process by the user, the control is generally not performed with the reserved code, so the resistance match signal may be preset to a low-level signal or a high-level signal before delivery to the user, and since the user does not send a reserved code related command, the user experience is not affected. Certainly, if the user sends a control command involving the reserved code, it can also ensure that the DRAM can perform related decoding and work normally.

In conclusion, in the embodiments of the disclosure, the reserved codes related to the output resistances Ron defined in the different mode registers in the DDR4 JEDEC SPEC are preset, so that better compatibility with the BIOS settings of different DRAM Controllers can be achieved.

The embodiments of the disclosure provide a compilation circuit. The specific implementation method of the above embodiments is described in detail by this embodiment, from which it can be seen that, with the preset compilation rule of the reserved code, the mode register can compile the reserved code sent by the application platform, so as to avoid the case that the mode register cannot work after receiving the reserved code; in addition, the compilation result of the reserved code is different according to the difference of the resistance matching signal, so that the mode register can adjust the resistance value in the DRAM, so as to match the different application platforms, which improves the compatibility of the mode register with the different application platforms.

In still another embodiment of the disclosure, the setting item Rtt_WR is used as an example to provide a specific example of the compilation circuit.

The above Table 2 shows the SPEC original definition table of the setting item Rtt_WR in some implementations, and the specific compilation circuit is shown in FIG. 5. The above Table 3 shows the SPEC improvement definition table of the setting item Rtt_WR in the embodiments of the disclosure, and the specific compilation circuit is shown in FIG. 6.

As can be seen from Table 3, when the signal to be compiled is a reserved code, the compiled value needs to be determined according to the reserved code itself and the resistance matching signal. Specifically, if the resistance matching signal is 1, the compiled value of the reserved code is RZQ/N; on the contrary, if the resistance matching signal is 0, the compiled value of the reserved code is Dynamic ODT Off. Here, the mapping relationship between the resistance matching signal and the specific compiled value may be determined according to an actual application scenario, which is not limited in the embodiments of the disclosure.

Figure 6:
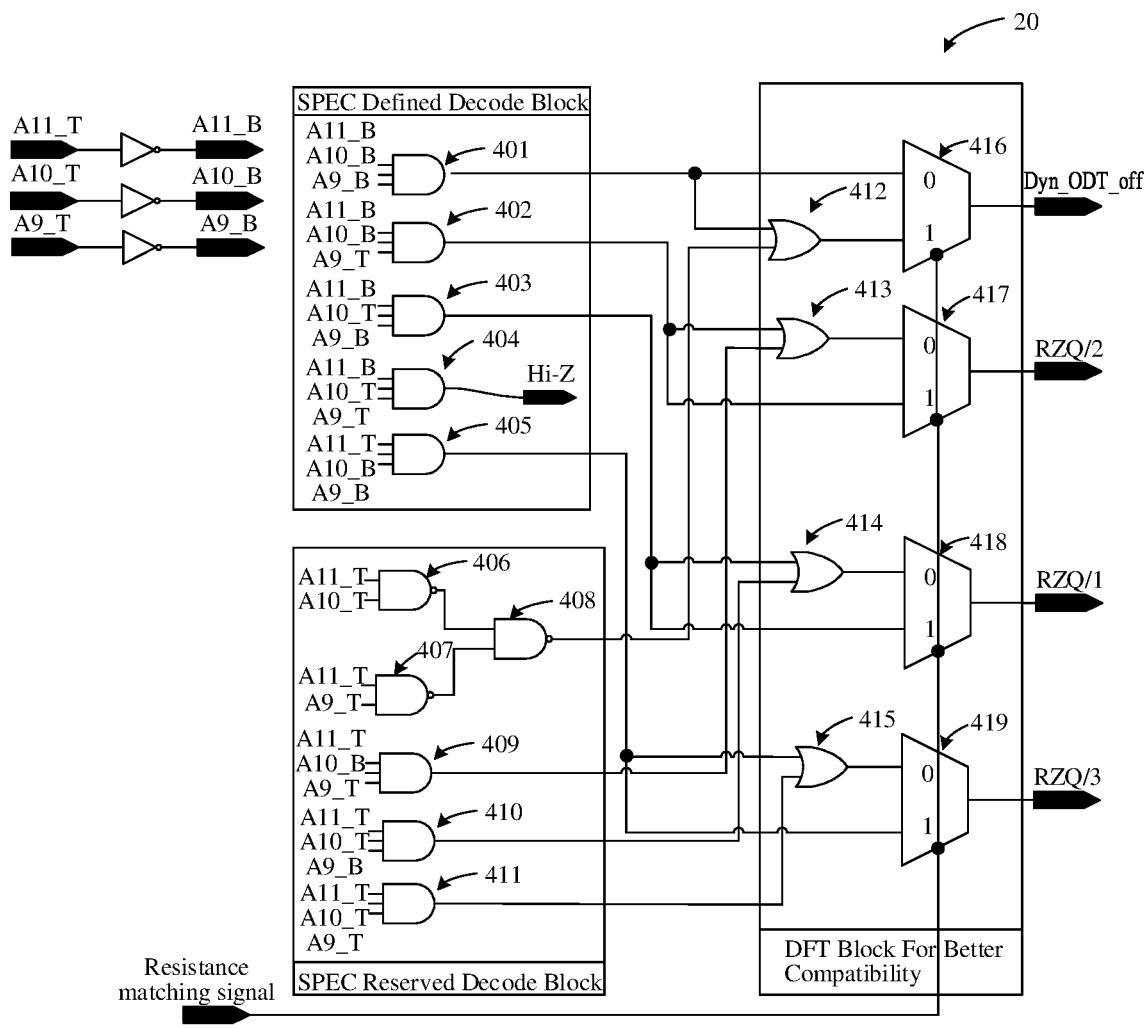
FIG. 6 illustrates a detailed schematic structural diagram of another compilation circuit provided by an embodiment of the disclosure.

As shown in FIG. 6, the compilation circuit includes an operator 401, an operator 402, an operator 403, an operator 404, an operator 405, an operator 406, an operator 407, an operator 408, an operator 410, an operator 411, an operator 412, an operator 413, an operator 414, an operator 415, a data selector 416 and a data selector 417, a data selector 418 and a data selector 419. The operators 401-405 and 409-411 are three-input AND gates, the operators 406-408 are dual-input NAND gates, and the operator 12-415 is dual-input OR gates, please refer to FIG. 6 for detailed connection of the above devices, and details are not described herein.

As shown in FIG. 6, from the view of functions, the compilation circuit 20 can be divided into three parts: (1) a SPEC Defined Decode Block; (2) a SPEC Reserved Decode Block; and (3) a DFT Block For Better Compatibility.

(1) The SPEC Defined Decode Block includes the operator 401 to the operator 405. The operator 401, the operator 402, the operator 403, and the operator 405 are configured to compile the first-class non-reserved code, that is, constitute a second alpha compilation circuit; the operator 404 is configured to compile the second non-reserved code, that is, constitutes a second beta compilation circuit.

(2) The SPEC Reserved Decode Block includes the operator 406 to the operator 411.

(3) The DFT Block For Better Compatibility includes the operator 412 to the operator 415, as well as the data selector 416 to the data selector 419.

According to the compilation circuit in FIG. 6, the specific compilation principle is as follows. In particular, according to the definition of DDR4, the setting item Rtt_WR is encoded by the three input bits A11, A10 and A1 of the mode register MR2. The input bit combination of Rtt_WR is described below by three bit values, for example, 110, which in turn represents the signal of A11 as logic 1, the signal of A10 as logic 1 and the signal of A9 as logic 0.

If the signal to be compiled is a first-class non-reserved code, for example, 000, at this time, the operator 401 outputs logic 1, the operators 406 and 407 output logic 1, the operator 408 outputs logic 0, thus the operator 412 outputs logic 1, both input ends of the data selector 416 are logic 1, no matter whether the resistance matching signal is 0 or 1, the data selector 416 outputs the logic 1, so the output end Dynamic ODT Off is a high level, the other operators output the logic 0, the other output ends are low level, and the final compiled value is Dynamic ODT off.

If the signal to be compiled is a second-class non-reserved code, such as 011, then the operator 404 outputs the logic 1, the output end Hi-Z is a high level, the operator 406 and the operator 407 both output the logic 1, the other operators output the logic 0, the other output ends are low level, and the final compiled value is Hi-Z.

If the signal to be compile is a reserved code, such as 101, on the one hand, the operator 401 to the operator 405 output logic 0, the operator 406 outputs logic 1, the operator 407 outputs logic 0, the operator 408 output logic 1, so that the operator 412 outputs logic 1, and the two input ports of the data selector 416 are logic 0 and logic 1 respectively; on the other hand, the operator 402 outputs logic 0, the operator 409 outputs logic 1, and the operator 413 outputs logic 1, so that the two input ports of the data selector 417 are logic 1 and logic 0, respectively. The remaining operators output logic 0. At this time, if the resistance matching signal is logic 0, data selector 416 selects output logic 0, data selector 417 selects output logic 1, the output end RZQ/2 is a high level, other output ends are low level, and the final compiled value is RZQ/2; conversely, if the resistance matching signal is logic 1, the data selector 416 outputs logic 1, the data selector 417 outputs logic 0, the output end Dynamic ODT Off is high level, other output ends are low level, and the final compiled value is Dynamic ODT Off.

It should be understood that FIG. 6 is only one circuit implementation method of Table 3 for a compilation circuit. Due to the diversity of logic devices, even for the same compilation truth table, it can be realized by a plurality of circuit structures, which is not exhaustive in the embodiments of the disclosure. Therefore, the corresponding circuit structure is within the protection scope of the embodiments of the disclosure as long as it conforms to the idea in the embodiments of the disclosure that the reserved code is coded and decoded in advance according to the resistance matching signal.

In addition, the application scenario of the embodiments of the disclosure generally appears in the test before the delivery of the user. In the usage process by the user, the control is generally not performed with the reserved code, so the resistance match signal may be preset to a low-level signal or a high-level signal before delivery to the user, and since the user does not send a reserved code related command, the user experience is not affected. Certainly, if the user sends a control command involving the reserved code, it can also ensure that the DRAM can perform related decoding and work normally.

In conclusion, in the embodiments of the disclosure, the reserved codes related to the output resistance Ron defined in the different mode registers in the DDR4 JEDEC SPEC are preset, so that better compatibility with the BIOS settings of different DRAM Controllers can be achieved.

The embodiments of the disclosure provide a compilation circuit. The specific implementation method of the above embodiments is described in detail by this embodiment, from which it can be seen that, with the preset compilation rule of the reserved code, the mode register can compile the reserved code sent by the application platform, so as to avoid the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with the different application platforms.

Figure 7:
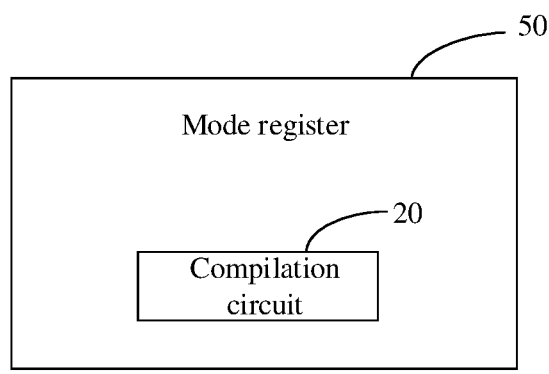
FIG. 7 illustrates a schematic structural diagram of a mode register provided by an embodiment of the disclosure.

In still another embodiment of the disclosure, referring to FIG. 7, a schematic structural diagram of a mode register 50 provided by an embodiment of the disclosure is shown. As shown in FIG. 7, the mode register 50 includes at least the above compilation circuit 20.

Since the mode register 50 includes the above compilation circuit 20, with the preset compilation rule of the reserved code, the mode register can compile the reserved code sent by the application platform, so as to avoid the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with the different application platforms.

Figure 8:
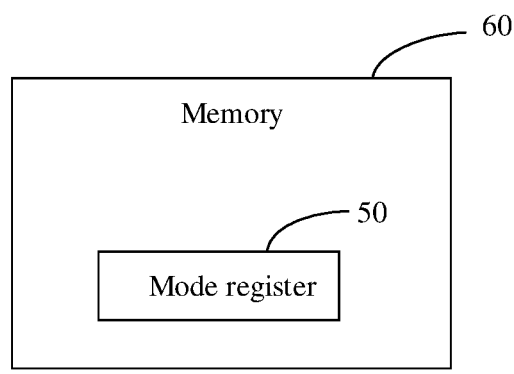
FIG. 8 illustrates a schematic structural diagram of a memory provided by an embodiment of the disclosure.

In still another embodiment of the disclosure, referring to FIG. 8, a schematic structural diagram of a memory 60 according to an embodiment of the disclosure is shown. As shown in FIG. 8, the memory 60 includes at least the above mode register 50.

Since the memory 60 includes the above mode register 50, with the preset compilation rule of the reserved code, the mode register can compile the reserved code sent by the application platform, so as to avoid the case that the mode register cannot work after receiving the reserved code; in addition, the compilation result of the reserved code is different according to the difference of the resistance matching signal, so that the mode register can adjust the resistance value in the DRAM, so as to match different application platforms, which improves the compatibility of the mode register with the different application platforms.

Furthermore, the memory 50 at least includes a dynamic random access memory (DRAM), and the DRAM complies with DDR4 memory specifications.

The above are merely some embodiments of the disclosure, and are not intended to limit the protection scope of the disclosure.

It should be noted that, in the disclosure, the terms "include" "contain" or any other variant thereof are intended to encompass non-exclusive inclusions such that a process, method, article, or apparatus that includes a series of elements includes not only those elements, but also other elements not explicitly listed, or elements inherent to such a process, method, article, or apparatus. Without further limitations, the element defined by the statement "including a . . . " does not rule out there are further identical elements in the process, method, article, or apparatus including the element.

The above embodiment number of the disclosure is merely for description, and does not represent the advantages or disadvantages of the embodiments.

The methods disclosed in the several method embodiments provided in the disclosure may be arbitrarily combined without conflict to obtain new method embodiments.

The features disclosed in the several product embodiments provided in the disclosure may be arbitrarily combined without conflict to obtain new product embodiments.

The features disclosed in the several method or equipment embodiments provided by the disclosure may be arbitrarily combined without conflict to obtain new method or equipment embodiments.

What is claimed is:

1. A compilation method, applied to a compilation circuit, and comprising:
   receiving a signal to be compiled and a resistance matching signal;
   performing compilation processing on the signal to be compiled to obtain a compilation result signal; and
   in a case where the signal to be compiled is a reserved code, performing compatibility selection processing on the compilation result signal according to the resistance matching signal to determine a first compiled value.

2. The compilation method according to claim 1, wherein performing compatibility selection processing on the compilation result signal according to the resistance matching signal to determine the first compiled value in the case where the signal to be compiled is the reserved code comprises:
   in a case where the resistance matching signal is a first level signal, determining the first compiled value as a first preset value corresponding to the reserved code; and
   in a case where the resistance matching signal is a second level signal, determining the first compiled value as a second preset value corresponding to the reserved code;
   wherein the first level signal is different from the second level signal, and the first preset value corresponding to the reserved code is different from the second preset value corresponding to the reserved code.

3. The compilation method according to claim 2, wherein the first level signal is a high level signal, and the second level signal is a low level signal.

4. The compilation method according to claim 1, wherein in a case where the signal to be compiled is a non-reserved code, the method further comprises:
   determining a second compiled value according to the compilation result signal.

5. The compilation method according to claim 4, wherein before receiving the signal to be compiled and the resistance matching signal, the method further comprises:
determining a value of the first compiled value according to a value of the second compiled value.

6. The compilation method according to claim 5, wherein determining the value of the first compiled value according to the value of the second compiled value comprises:
selecting from the value of the second compiled value to obtain at least one candidate value; and
determining the at least one candidate value as the value of the first compiled value.

7. The compilation method according to claim 6, wherein in a case of a number a of reserved codes, the method further comprises:
determining a number a of first candidate values and one second candidate value according to the at least one candidate value; and
determining an i-th first candidate value as the first preset value corresponding to an i-th reserved code, and determining the second candidate value as the second preset value corresponding to the i-th reserved code;
wherein i and a are positive integers, and i is less than or equal to a.

8. The compilation method according to claim 5, wherein determining the value of the first compiled value according to the value of the second compiled value comprises:
selecting from the value of the second compiled value to obtain at least one candidate value;
adjusting the at least one candidate value to obtain at least one adjusted value; and
determining the at least one candidate value and the at least one adjusted value as values of the first compiled value.

9. The compilation method according to claim 8, wherein in a case of a number a of reserved codes, a number of the at least one candidate value is a, and a number of the at least one adjusted value is a;
correspondingly, the method further comprises:
determining an i-th candidate value as the first preset value corresponding to an i-th reserved code, and determining an i-th adjusted value as the second preset value corresponding to the i-th reserved code;
wherein i and a are positive integers, and i is less than or equal to a.

10. The compilation method according to claim 1, wherein the reserved code comprises at least one of a first reserved code or a second reserved code; wherein the first reserved code is an output driver resistance (Ron) reserved code, and the second reserved code is an end resistance (RTT_WR) reserved code.

11. The compilation method according to claim 8, wherein in a case where the reserved code is a first reserved code, adjusting the at least one candidate value to obtain the at least one adjusted value comprises:
in a case where an i-th candidate value is a ratio of a preset resistance value to n, determining an i-th adjusted value as a ratio of the preset resistance value to (n+1);
wherein i and n are positive integers.

12. The compilation method according to claim 1, wherein the compilation circuit comprises a first compilation unit, a second compilation unit, and a compatibility selection unit, wherein the method further comprises:
in a case where the signal to be compiled is a reserved code, determining the first compiled value by the first compilation unit and the compatibility selection unit; and
in a case where the signal to be compiled is a non-reserved code, determining the second compiled value by the second compilation unit.

13. The compilation method according to claim 12, further comprising:
determining a first-class non-reserved code and a second-class non-reserved code; wherein the first-class non-reserved code comprises a non-reserved code having a same compiled value as the reserved code, and the second-class non-reserved code comprises a remaining non-reserved code in the non-reserved code except for the first-class non-reserved code;
correspondingly, the second compilation unit comprises a second alpha compilation unit and a second beta compilation unit, and the method further comprises:
in a case where the signal to be compiled is the reserved code or the first-type of non-reserved code, determining the first compiled value by the first compilation unit, the second alpha compilation unit, and the compatibility selection unit; and
in the case where the signal to be compiled is the second-class non-reserved code, determining a third compiled value by the second beta compilation unit; wherein the third compiled value is a remaining compiled value in the second compiled value except for the first compiled value.

14. The compilation method according to claim 13, wherein determining the first compiled value by the first compilation unit, the second alpha compilation unit, and the compatibility selection unit comprises:
performing compilation processing on the signal to be compiled by the first compilation unit to obtain a first compilation processing signal;
performing compilation processing on the signal to be compiled by the second alpha compilation unit to obtain a second alpha compilation processing signal; and
performing a logical operation on the first compilation processing signal, the second alpha compilation processing signal, and the resistance matching signal by the compatibility selection unit, and determining the first compiled value according to a logical operation result.

15. A compilation circuit, comprising:
a signal input end, configured to receive a signal to be compiled and a resistance matching signal;
a compilation unit, configured to perform compilation processing on the signal to be compiled to obtain a compilation result signal; and
a compatibility selection unit, configured to, in a case where the signal to be compiled is a reserved code, perform compatibility selection processing on the compilation result signal according to the resistance matching signal to determine a first compiled value.

16. The compilation circuit according to claim 15, wherein the compatibility selection unit is specifically configured to: in a case where the signal to be compiled is the reserved code and the resistance matching signal is a first level signal, determine the first compiled value as a first preset value corresponding to the reserved code; and in a case where the signal to be compiled is the reserved code and the resistance matching signal is a second level signal, determine the first compiled value as a second preset value corresponding to the reserved code;
wherein the first level signal is different from the second level signal, and the first preset value corresponding to the reserved code is different from the second preset value corresponding to the reserved code.

17. The compilation circuit according to claim 15, wherein the compilation circuit is further configured to, in a case where the signal to be compiled is a non-reserved code, determine a second compiled value according to the compilation result signal.

18. The compilation circuit according to claim 17, wherein the compilation unit comprises a first compilation unit and a second compilation unit;
wherein the first compilation unit is configured to compile the signal to be compiled to obtain a first compilation result signal;
the second compilation unit is configured to compile the signal to be compiled to obtain a second compilation result signal;
wherein the non-reserved code comprises a first-class non-reserved code, and the second compilation unit comprises a second alpha compilation unit;
the second alpha compilation unit is configured to perform compilation processing on the signal to be compiled to obtain a second alpha compilation result signal;
the compatibility selection unit is specifically configured to: in a case where the signal to be compiled is the first-class non-reserved code or where the signal to be compiled is the reserved code, perform a logical operation on the first compilation result signal, the second alpha compilation result signal and the resistance matching signal, and determine the first compiled value according to a logical operation result;
wherein the first-class non-reserved code comprises a non-reserved code having a same compiled value as the reserved code;
wherein the non-reserved code further comprises a second-class non-reserved code, and the second compilation unit further comprises a second beta compilation unit;
the second beta compilation unit is configured to: perform compilation processing on the signal to be compiled to obtain a second beta compilation result signal; and in the case where the signal to be compiled is the second-class non-reserved code, directly determine a third compiled value according to the second beta compilation result signal;
wherein the second-class non-reserved code comprises a remaining non-reserved code in the non-reserved code except for the first-class non-reserved code, and the third compiled value comprises a remaining compiled value in the second compiled value except for the first compiled value.

19. The compilation circuit according to claim 15, wherein the reserved code comprises at least one of a first reserved code or a second reserved code; wherein the first reserved code is an output driver resistance (Ron) reserved code, and the second reserved code is an end resistance (RTT_WR) reserved code.

20. A memory, comprising at least one compilation circuit,
wherein the compilation circuit comprises:
a signal input end, configured to receive a signal to be compiled and a resistance matching signal;
a compilation unit, configured to perform compilation processing on the signal to be compiled to obtain a compilation result signal; and
a compatibility selection unit, configured to, in a case where the signal to be compiled is a reserved code, perform compatibility selection processing on the compilation result signal according to the resistance matching signal to determine a first compiled value.

* * * * *